United States Patent
Savoj (10) Patent No.: US 7,551,897 B1
(45) Date of Patent: Jun. 23, 2009

(54) METHOD AND APPARATUS FOR PERFORMING TRANSMIT PRE-EMPHASIS

(75) Inventor: Jafar Savoj, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 118 days.

(21) Appl. No.: 11/616,256

(22) Filed: Dec. 26, 2006

Related U.S. Application Data (63) Continuation of application No. 10/903,331, filed on Jul. 30, 2004, now Pat. No. 7,155,164.

(60) Provisional application No. 60/576,797, filed on Jun. 3, 2004.

(51) Int. Cl.
 *H04B 1/00* (2006.01)
 *H04B 7/00* (2006.01)
(52) U.S. Cl. .................. 455/43; 455/114.3; 455/341; 326/82; 330/292; 375/296
(58) Field of Classification Search .................. 455/43, 455/114.3, 341, 42, 127.3, 144, 114.2, 194.2, 455/195.1, 253.2, 242.1; 327/131–134, 100, 327/108, 112, 170–172, 291; 330/254, 292; 381/2–4, 10, 14; 326/27, 82; 375/295–297
See application file for complete search history.

(56) References Cited

U.S. PATENT DOCUMENTS

| | | | |
|---|---|---|---|
| 4,802,236 A | | 1/1989 | Walczak et al. |
| 5,168,516 A | | 12/1992 | Ito |
| 5,303,405 A | | 4/1994 | Simmons et al. |
| 5,319,716 A | | 6/1994 | McGreevy |
| 5,448,757 A | | 9/1995 | Hirata |
| 5,659,581 A | * | 8/1997 | Betts et al. .................. 375/296 |
| 5,666,659 A | | 9/1997 | Kernaham et al. |
| 5,850,610 A | | 12/1998 | Testani et al. |
| 6,212,229 B1 | * | 4/2001 | Salinger .................. 375/224 |
| 6,313,682 B1 | | 11/2001 | Muller et al. |
| 6,570,406 B2 | * | 5/2003 | Tang et al. .................. 326/86 |
| 6,658,115 B1 | | 12/2003 | Lam |

(Continued)

OTHER PUBLICATIONS

IEEE Computer Society, "*IEEE Standard for Information Technology—Telecommunications and Information Exchange Between Systems—Local and Metropolitan Area Networks—Specific Requirements—Part 3: Carrier Sense Multiple Access with Collision Detection (CSMA/CD) Access Method and Physical Layer Specifications*—Amendment: Media Access Control (MAC) Parameters, Physical Layers, and Management Parameters for 10 Gb/s Operation", IEEE Std 802.3ae—2002.

(Continued)

*Primary Examiner*—Pablo N Tran (57) ABSTRACT

A pre-emphasis circuit and methods are provided. The circuit includes a first amplifier and a second amplifier. The first amplifier contains M first driver cells and is operable to amplify a signal. The second amplifier contains P second driver cells and is operable to amplify a delayed version of the signal The pre-emphasis circuit further includes logic circuit operable to change a pre-emphasis ratio of the pre-emphasis circuit including switching off one or more of the M first driver cells of the first amplifier and switching on a corresponding one or more of the P second driver cells of the second amplifier, such that a swing amplitude for an output signal provided by the pre-emphasis circuit is maintained at a constant level.

60 Claims, 3 Drawing Sheets

U.S. PATENT DOCUMENTS

| | | |
|---|---|---|
| 7,155,164 B1 | 12/2006 | Savoj |
| 7,205,787 B1 * | 4/2007 | Massoumi et al. ............ 326/30 |
| 7,236,757 B2 * | 6/2007 | Raghavan et al. ........... 455/203 |
| 2002/0135404 A1 * | 9/2002 | Payne et al. ................. 327/108 |
| 2002/0168024 A1 | 11/2002 | Hedberg |
| 2002/0171489 A1 | 11/2002 | Ritchie |
| 2004/0116160 A1 * | 6/2004 | Deas et al. .................. 455/570 |
| 2004/0184558 A1 | 9/2004 | Gregorius et al. |
| 2004/0247022 A1 * | 12/2004 | Raghavan et al. ........... 375/219 |
| 2005/0058219 A1 | 3/2005 | Liu |
| 2005/0088238 A1 | 4/2005 | Deas et al. |
| 2005/0105641 A1 | 5/2005 | Cheung et al. |
| 2005/0243983 A1 | 11/2005 | Causier |
| 2006/0006901 A1 | 1/2006 | Groen et al. |
| 2006/0071687 A1 | 4/2006 | Kim |
| 2007/0053421 A1 * | 3/2007 | Srodzinksi .................. 375/238 |

OTHER PUBLICATIONS

IEEE Computer Society, *"IEEE Standard for Information Technology—Telecommunications and Information Exchange Between Systems—Local and Metropolitan Area Networks—Specific Requirements—Part 3: Carrier Sense Multiple Access with Collision Detection (CSMA/CD) Access Method and Physical Layer Specifications"*, IEEE Std 802.3—2002.

\* cited by examiner

METHOD AND APPARATUS FOR PERFORMING TRANSMIT PRE-EMPHASIS

CROSS-REFERENCE TO RELATED APPLICATIONS

This application is a continuation (and claims the benefit of priority under 35 USC 120) of U.S. application Ser. No. 10/903,331, filed Jul. 30, 2004, now U.S. Pat. No. 7,155,164, issued on Dec. 26, 2006, which claims priority to commonly assigned U.S. Provisional Patent Application No. 60/576,797, filed on Jun. 3, 2004, which is incorporated herein by reference in its entirety.

BACKGROUND

The following disclosure relates to electrical circuits and signal processing.

In a typical communication system, signals (e.g., analog data signals) are transmitted from a transmitter to a receiver through a transmission channel (e.g., a twisted pair wire line channel). A frequency response of a transmission channel can attenuate higher frequency components of a transmitted signal. The attenuation (or signal loss) of a transmitted signal in the transmission channel can introduce undesired inter-symbol interference (ISI). To overcome signal loss within a transmission channel, conventional transmitters typically include a pre-emphasis circuit to amplify higher frequency components of a signal before the signal is transmitted to a receiver over a transmission line.

SUMMARY

In general, in one aspect, this specification describes a pre-emphasis circuit. The pre-emphasis circuit includes a first amplifier and a second amplifier. The first amplifier is operable to amplify a signal using a first amplifier current ($I_M$). The first amplifier contains M first driver cells, in which each of the M first driver cells are operable to amplify the signal and consume a portion of the first amplifier current. M is an number greater than zero. The second amplifier is operable to amplify a delayed version of the signal using a second amplifier current ($I_P$). The second amplifier contains P second driver cells, in which each of the P second driver cells are operable to amplify the delayed version of the signal and consume a portion of the second amplifier current ($I_P$). P is a number greater than zero.

The pre-emphasis circuit further includes a logic circuit operable to change a pre-emphasis ratio (a) of the pre-emphasis circuit including switching off one or more of the M first driver cells and switching on a corresponding one or more of the P second driver cells, such that a total current consumption of the first amplifier and the second amplifier ($I_M+I_P$) remains substantially constant.

Particular implementations may include one or more of the following features. The logic circuit can change the pre-emphasis ratio (a) of the transmitter including switching off one or more of the P second driver cells and switching on one or more of the M first driver cells, such that a total current consumption of the first amplifier and the second amplifier ($I_M+I_P$) remains substantially constant. The logic circuit can include a thermometer encoder operable to generate one or more select bits for switching on and off one or more of the M first driver cells and one or more of the P second driver cells. The thermometer encoder can generate the one or more select bits based on three control bits. M can be equal to 16. A fixed number of the M driver cells can remain on at all times. The fixed number of driver cells can consume approximately 60% of a total current consumption of all of the M driver cells combined. One or more of the M driver cells can consume approximately 3%, 6% or 9% of the total current consumption of all of the M driver cells combined.

The signal can be an analog signal. The pre-emphasis circuit can further include a subtractor operable to subtract an output of the second amplifier from an output of the first amplifier and generate an output signal for the pre-emphasis circuit having a predetermined pre-emphasis level. The pre-emphasis circuit can further include a delay element operable to generate the delayed version of the signal from the signal. The delayed version of the signal can delay the signal by one bit period. The pre-emphasis circuit can have the following transfer function: $H(z)=1-az^{-1}$.

In general, in another aspect, this specification describes a control circuit for changing a pre-emphasis ratio of a pre-emphasis circuit. The pre-emphasis circuit includes a first amplifier and a second amplifier. The first amplifier includes M first driver cells, and the second amplifier includes P driver cells. M and P are each a number greater than or equal to zero. The control circuit includes a logic circuit for generating a one or more control signals operable to switch off one or more of the M first driver cells and switch on a corresponding one or more of the P second driver cells, such that a total current consumption of the first amplifier and the second amplifier ($I_M+I_P$) remains substantially at a pre-determined constant level.

In general, in another aspect, this specification describes a transceiver including features of a pre-emphasis circuit described above. The transceiver can operate at a data rate greater than or equal to 1.25 Gb/s. The transceiver can be IEEE 1000Base-TX compliant.

Implementations can include one or more of the following advantages. A method and apparatus is provided for performing pre-emphasis using a pre-emphasis circuit in a high speed transmitter (e.g., 1.25-2.5 Gb/s). The pre-emphasis circuit includes a logic circuit that advantageously maintains a current consumption of the combination of a main amplifier and a pre-emphasis amplifier substantially at a constant level as the logic circuit switches on and off portions of driver cells in the main amplifier and the pre-emphasis amplifier. Accordingly, a voltage swing of an output signal of the pre-emphasis circuit remains substantially constant as the pre-emphasis ratio of pre-emphasis circuit changes. In addition, larger pre-emphasis ratios (e.g., up to 430%) can be attained.

The details of one or more implementations are set forth in the accompanying drawings and the description below. Other features and advantages will be apparent from the description and drawings, and from the claims.

DETAILED DESCRIPTION

Figure 1:
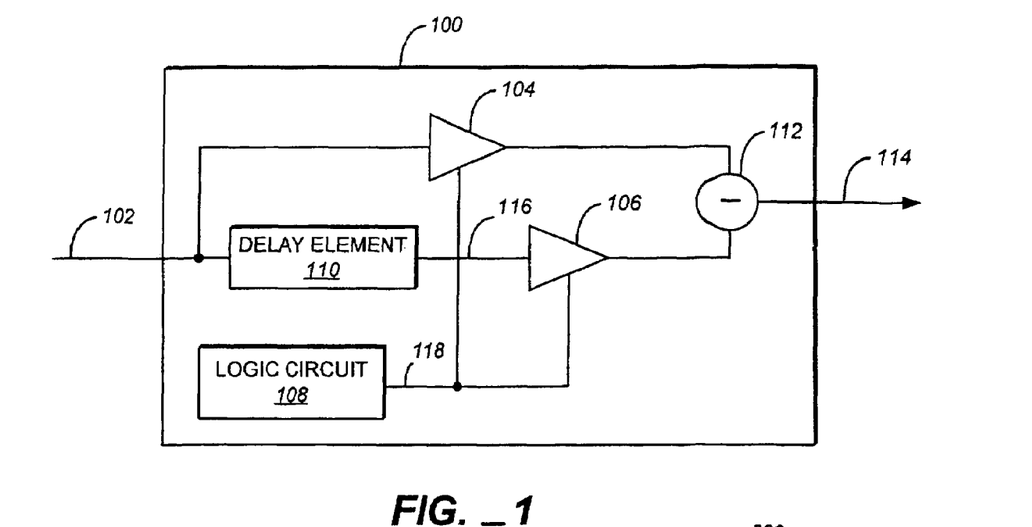
FIG. 1 is block diagram of a pre-emphasis circuit.

FIG. 1 illustrates a block diagram of a pre-emphasis circuit 100. In one implementation, pre-emphasis circuit 100 amplifies higher frequency components of an input signal 102 before input signal 102 is transmitted to a receiver over a transmission channel. Input signal 102 can be any type of signal, for example, data signals of a binary nature. Pre-emphasis circuit 100 includes a main amplifier 104, a pre-emphasis amplifier 106, a logic circuit 108, a delay element 110, and a subtractor 112.

An input of main amplifier 104 is in communication with input signal 102 and an output of main amplifier 104 is in communication with a first input of subtractor 112. An input of pre-emphasis amplifier 106 is in communication with an output of delay element 110 and an output of pre-emphasis amplifier 106 is in communication with a second input of subtractor 112. An output of logic circuit 108 is in communication with a control input of main amplifier 104 and a control input of pre-emphasis amplifier 106. An input of delay element 110 is in communication with input signal 102 and an output of delay element 110 is in communication with an input of pre-emphasis amplifier 106. An output of subtractor 112 represents an output signal 114 having a pre-determined amount of pre-emphasis and voltage swing.

Main amplifier 104 includes one or more conventional drivers cells (not shown) for amplifying input signal 102. Main amplifier 104 consumes a total amount of current ($I_M$) that is dependent upon a total number of driver cells that are enabled (e.g., "on") within main amplifier 104. Pre-emphasis amplifier 106 includes one or more conventional drivers cells (not shown) for amplifying delay signal 116. Delay signal 116 is generated by delay element 110. Delay element 110 can include a flip-flop or a latch (not shown). In one implementation, delay signal 116 delays input signal 102 by one bit period. Pre-emphasis amplifier 106 consumes a total amount of current ($I_P$) that is dependent upon a total number of driver cells that are enabled (e.g., "on") within pre-emphasis amplifier 106.

A pre-emphasis ratio of pre-emphasis circuit 100 is given by the following equation:

$$a = \frac{I_M + I_P}{I_M - I_P} - 1 \quad \text{(e.q. 1)}$$

where "a" is a real constant representing the pre-emphasis ratio, "$I_M$" is the total current consumption of main amplifier 104, and "$I_P$" is the total current consumption of pre-emphasis amplifier 106. The pre-emphasis ratio (a) determines the amount of, pre-emphasis applied to input signal 102 by pre-emphasis circuit 100.

Logic circuit 108 includes control circuitry for changing the pre-emphasis ratio (a) of pre-emphasis circuit 100. In one implementation, logic circuit 108 changes the pre-emphasis ratio by generating a control signal 118 that switches on (and off) driver cells (or combinations thereof) within each of main amplifier 104 and pre-emphasis amplifier 106 such that the following equation is satisfied:

$$I_M + I_P = C \quad \text{(e.q. 2)}$$

where "C" is a pre-determined constant. For example, logic circuit 108 is operable to change the pre-emphasis ratio (a) by switching off one or more of the driver cells in main amplifier 104 and switching on one or more corresponding driver cells in pre-emphasis amplifier 106, such that the one or more of the driver cells switched on (in pre-emphasis amplifier 106) consume an amount of current substantially equal to an amount of current previously consumed by the one or more of the driver cells switched off (in main amplifier 104).

Subtractor 112 is operable to subtract the output of pre-emphasis amplifier 106 from the output of main amplifier 104 and generate output signal 114 having a pre-determined amount of pre-emphasis. Accordingly, in one implementation, pre-emphasis circuit 100 has the following transfer function:

$$H(z) = 1 - az^{-1} \quad \text{(e.q. 3)}$$

where "z" is a frequency response variable, and "a" is the real constant representing the pre-emphasis ratio of pre-emphasis circuit 100.

Figure 2:
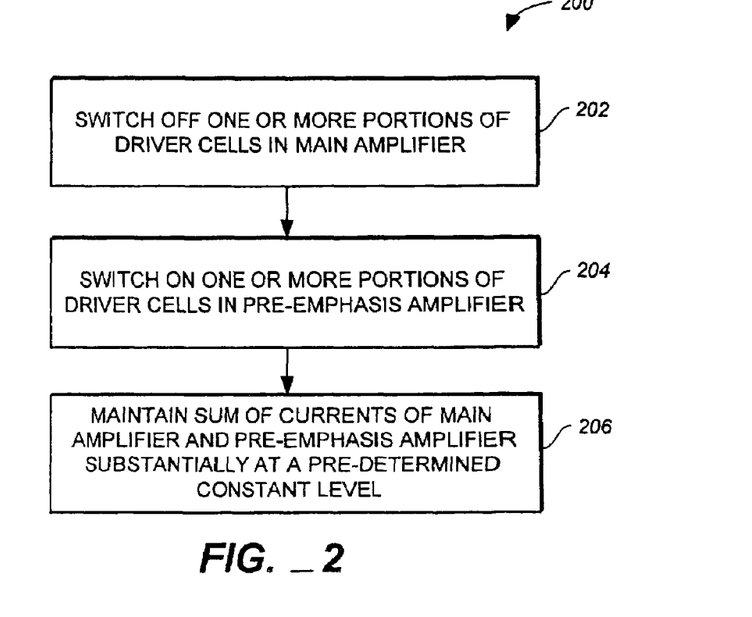
FIG. 2 is shows a method for changing a pre-emphasis ratio of the pre-emphasis circuit of FIG. 1.

FIG. 2 shows a method 200 for changing a pre-emphasis ratio of a pre-emphasis circuit (e.g., pre-emphasis circuit 100 of FIG. 1) including a main amplifier and a pre-emphasis amplifier. One or more of the driver cells in the main amplifier (e.g., main amplifier 104) are switched off (step 202). The main amplifier can contain any number of driver cells for amplifying an input signal (e.g., input signal 102). The main amplifier consumes less current as one or more of the driver cells are switched off. One or more of the driver cells in the pre-emphasis amplifier (e.g., pre-emphasis amplifier 106) are switched on (step 204). The pre-emphasis amplifier can contain any number of driver cells for amplifying a delayed input signal (e.g., delay signal 116). In one implementation, the delay signal delays the input signal by one bit period. The pre-emphasis amplifier consumes more current as one or more of the driver cells are switched on.

A sum of current consumed by the main amplifier and current consumed by the pre-emphasis amplifier (e.g., $I_M + I_P$) is substantially maintained at a pre-determined constant level (step 206). The pre-determined constant level corresponds to a desired constant voltage swing amplitude for an output signal (e.g., output signal 114). In one implementation, a logic circuit (e.g., logic circuit 108) maintains the sum of currents substantially at a pre-determined constant level using a control signal for switching off the one or more driver cells in the main amplifier and switching on the one or more driver cells in the pre-emphasis amplifier. The logic circuit can include any number of conventional logic circuits (e.g., logic gates) for generating the control signal.

Figure 3:
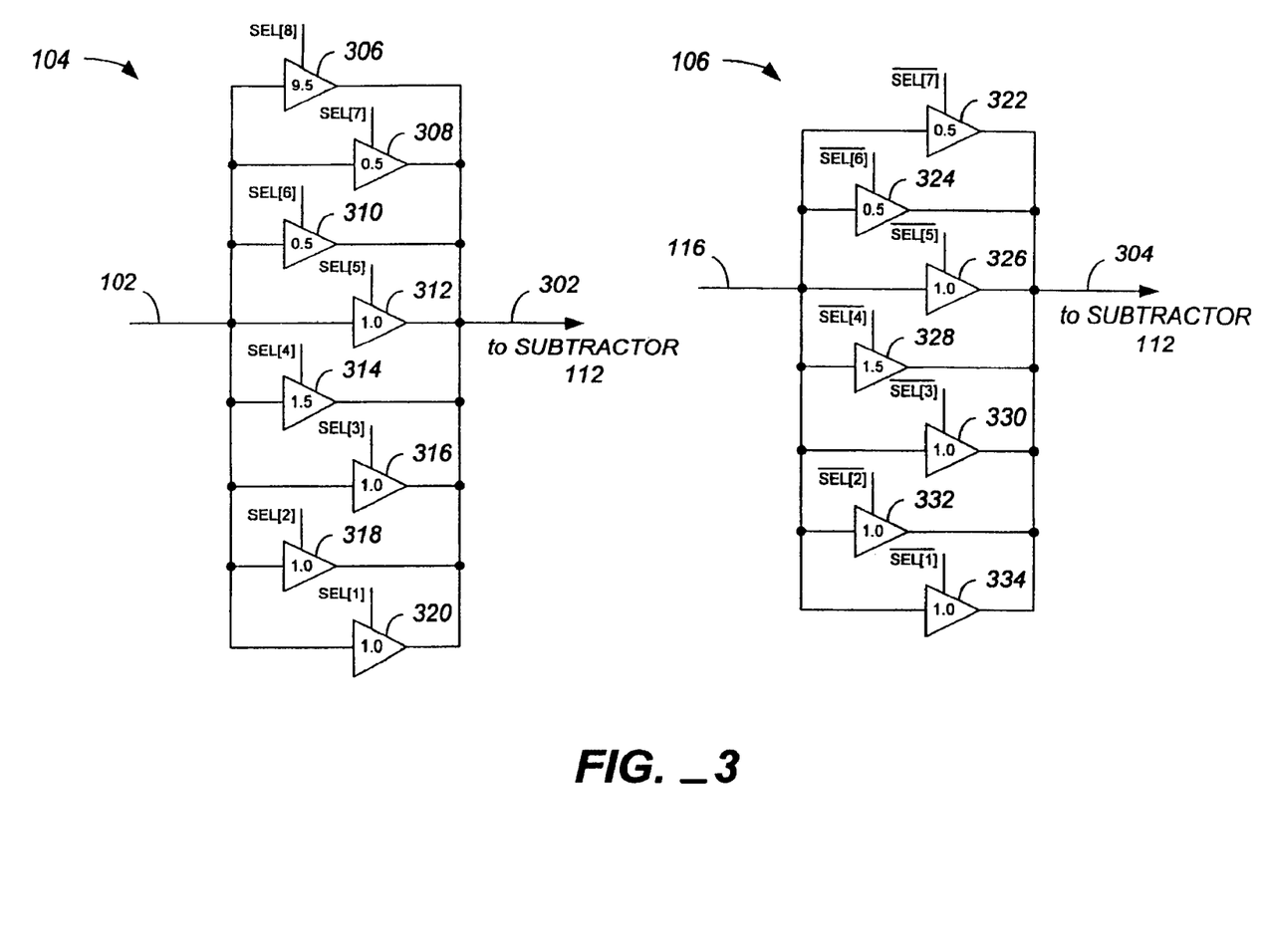
FIG. 3 is block diagram showing a configuration of the amplifiers in the pre-emphasis circuit of FIG. 1.

FIG. 3 illustrates one implementation of main amplifier 104 and pre-emphasis amplifier 106 of FIG. 1.

In one implementation, main amplifier 104 includes a first driver cell—e.g., driver cell 306—and one or more second driver cells—e.g., driver cells 308-320. In one implementation, the first driver cell is enabled (e.g., switched "on") at all times. In one implementation, the first driver cell (e.g., driver cell 306) is sized to consume approximately 60% of the total current consumption capability of main amplifier 104. The total current consumption capability of main amplifier 104 is given when all off the driver cells (e.g., driver cells 306-320) of main amplifier 104 are enabled.

In one implementation, the one or more second driver cells are operable to be selectively enabled (e.g., switched "on" and "off"). In one implementation, the one or more second driver cells are variably sized to have a different current consumption. More specifically, each of driver cells 308, 310 can be sized to consume approximately 3% of the total current consumption capability of main amplifier 104. Each of driver cells 312, 316, 318, 320 can be sized to consume approximately 6% of the total current consumption capability of main amplifier 104. Driver cell 314 can be sized to consume approximately 9% of the total current consumption capability of main amplifier 104.

The inputs of each of driver cells 306-320 are coupled together and are in communication with input signal 102. The outputs of each of driver cells 306-320 are coupled together to form an amplified output 300. Amplified output 300 is received by an input of subtractor 112 (FIG. 1).

In one implementation, pre-emphasis amplifier 106 includes one or more driver cells (e.g., driver cells 322-334) that are operable to be selectively enabled. In one implementation, the one or more driver cells in pre-emphasis amplifier 106 (e.g., driver cells 322-334) correspond to the one or more second driver cells (e.g., driver cells 308-320) in main amplifier 104. That is, driver cells 322-334 have a total current consumption that is substantially equivalent to a total current consumption of second driver cells 308-320. In one implementation, there is a one-to-one correspondence between the one or more second driver cells (e.g., driver cells 308-320) of main amplifier 104 and the one or more driver cells (e.g., driver cells 322-334) of pre-emphasis amplifier 106. In particular, each of driver cells 322, 324 can consume an amount of current substantially equivalent to, e.g., second driver cell 308 and 310, respectively. Each of driver cells 326, 330, 332, 334 can consume an amount of current substantially equivalent to, e.g., second driver cell 312, 316, 318, and 320, respectively. Driver cell 328 can consume an amount of current substantially equivalent to second driver cell 314.

The inputs of each of driver cells 322-334 are coupled together and are in communication with delay signal 116. The outputs of each of driver cells 322-334 are coupled together to form an amplified output 304. Amplified output 304 is received by a second input of subtractor 112 (FIG. 1).

In one implementation, seven (7) control signals—i.e., SEL[7]-SEL[1])—are generated by logic circuit 108 (FIG. 1) for respectively switching off (and on) ones of driver cells 308-320 of main amplifier 104. Seven (7) control signals—i.e., complements of SEL[7]-SEL[1]—are generated by logic circuit 108 (FIG. 1) for respectively switching on (and off) ones of driver cells 322-334 of pre-emphasis amplifier 106.

Thus, for example, during operation if all of driver cells 306-320 of main amplifier 104 are switched "on", then all of driver cells 322-334 of pre-emphasis amplifier 106 are switched "off". Similarly, as any individual driver cell in main amplifier 104 is switched off, a corresponding driver cell in pre-emphasis amplifier 106 is switched on. In one implementation, each of the corresponding driver cells in main amplifier 104 and pre-emphasis amplifier 106 are sized to have substantially an equivalent current consumption. Accordingly, a sum of current consumed by main amplifier 104 (FIG. 1) and current consumed by pre-emphasis amplifier 106 (FIG. 1) (i.e., $I_M + I_P$) is substantially maintained at a pre-determined constant level.

Figure 4:
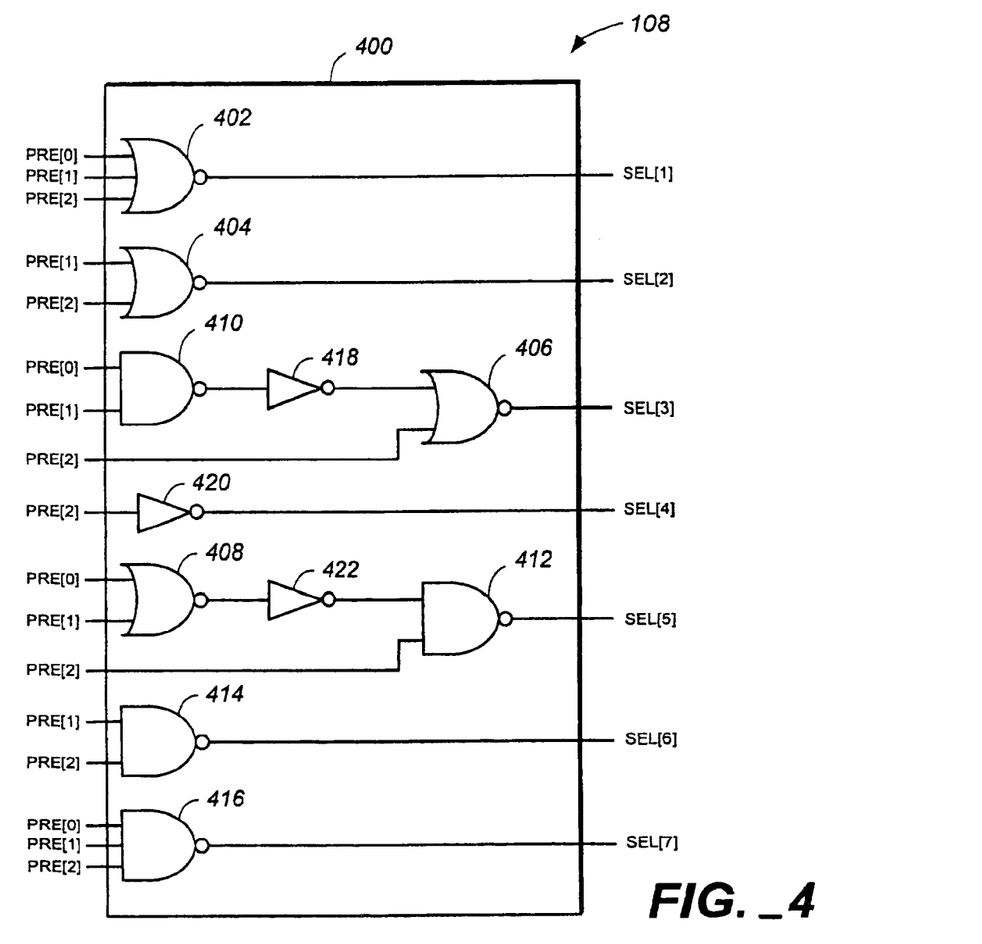
FIG. 4 is a schematic diagram of a logic circuit of the pre-emphasis circuit of FIG. 1.

FIG. 4 illustrates one implementation of logic circuit 108. In one implementation, logic circuit 108 includes a thermometer encoder 400 that converts a 3-bit input signal (PRE[2:0]) to seven (7) control signals (i.e., control signals SEL[1]-SEL

[7]. Logic circuit 108 includes NOR gates 402-408, NAND gates 410-416, and inverters 418-422.

NOR gate 402 is a 3-input NOR gate that receives input signals PRE[0], PRE[1], and PRE[2]. The output of NOR gate 402 represents control signal SEL[1]. NOR gate 404 is a 2-input NOR gate that receives input signals PRE[L] and PRE[2]. The output of NOR gate 404 represents control signal SEL[2]. NAND gate 410 is a 2-input NAND gate that receives as inputs PRE[0] and PRE[1]. The output of NAND gate 410 is in communication with the input of inverter 418. NOR gate 406 is a 2-input NOR gate that receives as inputs PRE[2] and the output of inverter 418. The output of NOR gate 406 represents control signal SEL[3]. Inverter 420 receives input signal PRE[2]. The output of inverter 420 represents control signal SEL[4]. NOR gate 408 is a 2-input NOR gate that receives as inputs PRE[0] and PRE[1] The output of NOR gate 408 is in communication with the input of inverter 422. NAND gate 412 is a 2-input NAND gate that receives as inputs PRE[2] and the output of inverter 422. The output of NAND gate 412 represents control signal SEL[5]. NAND gate 414 is a 2-input NAND gate that receives input signals PRE[1] and PRE [2]. The output of NAND gate 414 represents control signal SEL[6]. NAND gate 416 is a 3-input NAND gate that receives input signals PRE[0], PRE[1], and PRE [2]. The output of NAND gate 416 represents control signal SEL[7]. Control signal SEL[8] can be fixed at a high voltage to maintain a first driver cell (e.g., driver cell 306 (FIG. 3)) in an "on" state at all times.

Generally, as input signals PRE[2:0] advances from 000 to 111, logic circuit 108 incrementally switches off one or more of the driver cells of main amplifier 104 (FIG. 1) and switches on one or more of the driver cells of pre-emphasis amplifier 106 (FIG. 1) having an equivalent current consumption, as shown in Table 1 below.

TABLE 1

| PRE [2:0] | PE % | # Cells (M) | # Cells (P) | SEL [8] | SEL [7] | SEL [6] | SEL [5] | SEL [4] | SEL [3] | SEL [2] | SEL [1] |
|---|---|---|---|---|---|---|---|---|---|---|---|
| 000 | 0 | 16 | 0 | 1 | 1 | 1 | 1 | 1 | 1 | 1 | 1 |
| 001 | 14 | 15 | 1 | 1 | 1 | 1 | 1 | 1 | 1 | 1 | 0 |
| 010 | 33 | 14 | 2 | 1 | 1 | 1 | 1 | 1 | 1 | 0 | 0 |
| 011 | 60 | 13 | 3 | 1 | 1 | 1 | 1 | 1 | 0 | 0 | 0 |
| 100 | 128 | 11.5 | 4.5 | 1 | 1 | 1 | 1 | 0 | 0 | 0 | 0 |
| 101 | 220 | 10.5 | 5.5 | 1 | 1 | 1 | 0 | 0 | 0 | 0 | 0 |
| 110 | 300 | 10 | 6 | 1 | 1 | 0 | 0 | 0 | 0 | 0 | 0 |
| 111 | 430 | 9.5 | 6.5 | 1 | 0 | 0 | 0 | 0 | 0 | 0 | 0 |

Figure 5:
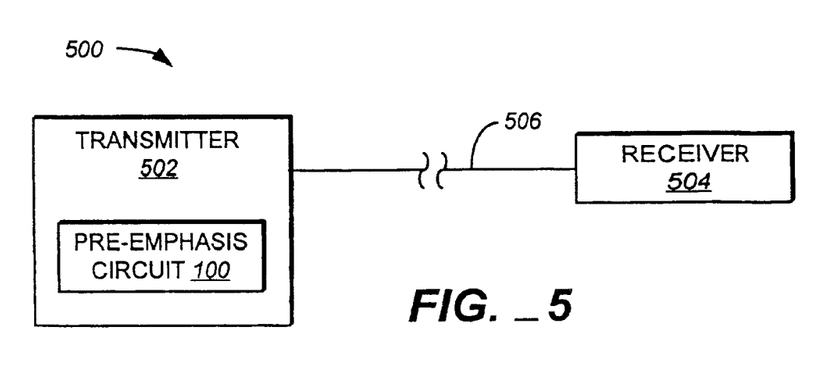
FIG. 5 is a block diagram of a transceiver system.
Like reference symbols in the various drawings indicate like elements.

FIG. 5 illustrates a block diagram of a transceiver system 500. In one implementation, transceiver system 500 is IEEE 1000Base-TX compliant. Transceiver system 500 can also be compliant with other IEEE standards, e.g., IEEE XAUI (2.5/3.125 Gb/s). Transceiver system 500 includes a transmitter 502, a receiver 504, and a transmission channel 506. Transmission channel 506 passes signals (e.g., analog signals) from transmitter 502 to receiver 504. Transmission channel 506 can include any type of wire line channel, for example, a single-ended transmission wire line or a pair of differential transmission wire lines (e.g., a Cat-5 twisted pair cable, optical fiber, printed circuit board (PCB) transmission line, and so on). Transmitter 502 includes pre-emphasis circuit 100 for amplifying higher frequency components of a signal before the signal is transmitted to receiver 504 over transmission channel 506.

A number of implementations have been described. Nevertheless, it will be understood that various modifications may be made without departing from the spirit and scope of the invention. For example, the step of methods described above may be performed in a different order and still achieve desirable results. Also, main amplifier 104 and pre-emphasis amplifier 106 can each contain a different total number of driver cells other than as described above to achieve different pre-emphasis ratios. In addition, each driver cell within main amplifier 104 and pre-emphasis amplifier 106 can be sized to consume a different percentage of the total current consumption capability of each respective amplifier than as described above to achieve different pre-emphasis ratios. Accordingly, other implementations are within the scope of the following claims.

What is claimed is:

1. A pre-emphasis circuit comprising:
a first amplifier operable to amplify a signal, the first amplifier containing M first driver cells, M being a number greater than zero;
a second amplifier operable to amplify a delayed version of the signal, the second amplifier containing P second driver cells, P being a number greater than zero; and
a logic circuit operable to change a pre-emphasis ratio of the pre-emphasis circuit including switching off one or more of the M first driver cells and switching on a corresponding one or more of the P second driver cells, such that a swing amplitude for an output signal provided by the pre-emphasis circuit is maintained at a constant level.

2. A pre-emphasis circuit comprising:
a first amplifier operable to amplify a signal using a first amplifier current ($I_M$), the first amplifier containing M first driver cells, M being a number greater than zero;
a second amplifier operable to amplify a delayed version of the signal using a second amplifier current ($I_P$), the second amplifier containing P second driver cells, P being a number greater than zero; and
a logic circuit operable to change a pre-emphasis ratio of the pre-emphasis circuit including switching off one or more of the M first driver cells and switching on a corresponding one or more of the P second driver cells, such that a total current consumption of the first amplifier and the second amplifier ($I_M + I_P$) remains substantially constant where the substantially constant level corresponds to a desired constant voltage swing amplitude for an output signal.

3. The pre-emphasis circuit of claim 2, wherein the logic circuit is operable to change the pre-emphasis ratio of the pre-emphasis circuit including switching off one or more of the P second driver cells and switching on one or more of the M first driver cells, such that a total current consumption of the first amplifier and the second amplifier remains substantially constant.

4. The pre-emphasis circuit of claim 3, wherein the logic circuit includes a thermometer encoder operable to generate one or more select bits for switching on and off one or more of the M first driver cells and one or more of the P second driver cells.

5. The pre-emphasis circuit of claim 4, wherein the thermometer encoder is operable to generate the one or more select bits based on three control bits.

6. The pre-emphasis circuit of claim 2, wherein M is equal to 16.

7. The pre-emphasis circuit of claim 2, wherein a fixed number of the M first driver cells remains on at all times.

8. The pre-emphasis circuit of claim 7, wherein the fixed number of the M first driver cells consumes approximately 60% of a total current consumption of all of the M driver cells combined.

9. The pre-emphasis circuit of claim 2, wherein one or more of the M first driver cells consume a different amount of current relative to another one of the M first driver cells.

10. The pre-emphasis circuit of claim 2, wherein one or more of the P second driver cells consume a different amount of current relative to another one of the P second driver cells.

11. The pre-emphasis circuit of claim 2, wherein the signal is an analog signal.

12. The pre-emphasis circuit of claim 2, further comprising a subtractor operable to subtract an output of the second amplifier from an output of the first amplifier and generate the output signal for the pre-emphasis circuit having a predetermined pre-emphasis level.

13. The pre-emphasis circuit of claim 12, further comprising a delay element operable to generate the delayed version of the signal from the signal.

14. The pre-emphasis circuit of claim 13, wherein the delayed version of the signal delays the signal by one bit period.

15. The pre-emphasis circuit of claim 14, wherein the pre-emphasis circuit has the following transfer function:

$$H(z)=1-az-1.$$

16. A transceiver comprising the pre-emphasis circuit of claim 2.

17. The transceiver of claim 16, wherein the transceiver operates at a data rate greater than or equal to 1.25 Gb/s.

18. The transceiver of claim 16, wherein the transceiver is IEEE 1000Base-TX compliant.

19. A control circuit for changing a pre-emphasis ratio of a pre-emphasis circuit, the pre-emphasis circuit including a first amplifier and a second amplifier, the first amplifier including M first driver cells, the second amplifier including P second driver cells, M and P each being a number greater than or equal to one, the control circuit comprising:
a logic circuit for generating one or more control signals operable to switch off one or more of the M first driver cells and switch on a corresponding one or more of the P second driver cells, such that a swing amplitude for an output signal provided by the pre-emphasis circuit is maintained at a constant level.

20. The control circuit of claim 19, wherein the logic circuit includes a thermometer encoder operable to generate one or more select bits for switching on and off one or more of the M first driver cells and one or more of the P second driver cells.

21. The control circuit of claim 20, wherein the thermometer encoder incrementally switches off one or more of the M first driver cells and switches on one or more of the P second driver cells having an equivalent current consumption.

22. The control circuit of claim 19, wherein the constant level corresponds to a substantially constant voltage swing amplitude of a signal that represents a difference between an output of the first amplifier and the second amplifier.

23. The control circuit of claim 19, wherein one or more of the M first driver cells consume a different amount of current relative to another one of the M first driver cells.

24. The control circuit of claim 19, wherein one or more of the P second driver cells consume a different amount of current relative to another one of the P second driver cells.

25. A pre-emphasis circuit comprising:
a first amplifier means for amplifying a signal, the first amplifier means containing M first driver cell means, M being a number greater than zero;

a second amplifier means for amplifying a delayed version of the signal, the second amplifier means containing P second driver cell means, P being a number greater than zero; and a logic circuit means for changing a pre-emphasis ratio of the pre-emphasis circuit including switching off one or more of the M first driver cell means and switching on a corresponding one or more of the P second driver cell means, such that a swing amplitude for an output signal provided by the pre-emphasis circuit is maintained at a constant level.

26. The pre-emphasis circuit of claim 25, wherein the logic circuit means is operable to change the pre-emphasis ratio of the pre-emphasis circuit including switching off one or more of the P second driver cell means and switching on one or more of the M first driver cell means, such that a total current consumption of the first amplifier means and the second amplifier means remains substantially constant.

27. The pre-emphasis circuit of claim 26, wherein the logic circuit means includes an encoder means for generating one or more select bit means for switching on and off one or more of the M first driver cell means and one or more of the P second driver cell means.

28. The pre-emphasis circuit of claim 27, wherein the encoder means is operable to generate the one or more select bit means based on three control bit means.

29. The pre-emphasis circuit of claim 25, wherein M is equal to 16.

30. The pre-emphasis circuit of claim 25, wherein a fixed number of the M first driver cell means remains on at all times.

31. The pre-emphasis circuit of claim 30, wherein the fixed number of the M first driver cell means consumes approximately 60% of a total current consumption of all of the M first driver cell means combined.

32. The pre-emphasis circuit of claim 25, wherein one or more of the M first driver cell means consume a different amount of current relative to another one of the M first driver cell means.

33. The pre-emphasis circuit of claim 25, wherein one or more of the P second driver cell means consume a different amount of current relative to another one of the P second driver cell means.

34. The pre-emphasis circuit of claim 25, wherein the signal is an analog signal.

35. The pre-emphasis circuit of claim 25, further comprising a subtractor means operable to subtract an output of the second amplifier means from an output of the first amplifier means and generate the output signal for the pre-emphasis circuit having a predetermined pre-emphasis level.

36. The pre-emphasis circuit of claim 35, further comprising a delay element means operable to generate the delayed version of the signal from the signal.

37. The pre-emphasis circuit of claim 36, wherein the delayed version of the signal delays the signal by one bit period.

38. The pre-emphasis circuit of claim 37, wherein the pre-emphasis circuit has the following transfer function:

$$H(z)=1-az-1.$$

39. A transceiver comprising the pre-emphasis circuit of claim 25.

40. The transceiver of claim 39, wherein the transceiver operates at a data rate greater than or equal to 1.25 Gb/s.

41. The transceiver of claim 39, wherein the transceiver is IEEE 1000Base-TX compliant.

42. A method for changing a pre-emphasis ratio of a pre-emphasis circuit, comprising:

amplifying a signal using M first driver cells of a first amplifier, M being a number greater than zero;

amplifying a delayed version of the signal using P second driver cells of a second amplifier, P being a number greater than zero; and changing a pre-emphasis ratio of the pre-emphasis circuit including switching off one or more of the M first driver cells and switching on a corresponding one or more of the P second driver cells, such that a swing amplitude for an output signal provided by the pre-emphasis circuit is maintained at a constant level.

43. The method of claim 42, further comprising changing the pre-emphasis ratio of the pre-emphasis circuit including switching off one or more of the P second driver cells and switching on one or more of the M first driver cells, such that a total current consumption of the first amplifier and the second amplifier remains substantially constant.

44. The method of claim 42, wherein changing a pre-emphasis ratio includes generating one or more select bits for switching on and off one or more of the M first driver cells and one or more of the P second driver cells.

45. The method of claim 44, wherein generating one or more select bits includes generating the one or more select bits based on three control bits.

46. The method of claim 42, wherein M is equal to 16.

47. The method of claim 42, further comprising maintaining a fixed number of the M first driver cells on at all times.

48. The method of claim 47, wherein maintaining a fixed number of the M first driver cells on at all times includes maintaining a fixed number of the M first driver cells that consumes approximately 60% of a total current consumption of all of the M first driver cells combined.

49. The method of claim 42, further comprising subtracting an output of the second amplifier from an output of the first amplifier and generating the output signal for the pre-emphasis circuit having a predetermined pre-emphasis level.

50. The method of claim 49, further comprising generating the delayed version of the signal from the signal.

51. The method of claim 50, wherein generating the delayed version of the signal includes generating the delayed version of the signal that delays the signal by one bit period.

52. A control circuit for changing a pre-emphasis ratio of a pre-emphasis circuit, the pre-emphasis circuit including a first amplifier means and a second amplifier means, the first amplifier means including M first driver cell means, the second amplifier means including P second driver cell means, M and P each being a number greater than zero, the control circuit comprising:

a logic circuit means for generating one or more control signal means operable to switch off one or more of the M first driver cell means and switch on a corresponding one or more of the P second driver cell means, such that a swing amplitude for an output signal provided by the pre-emphasis circuit is maintained at a constant level.

53. The control circuit of claim 52, wherein the logic circuit means includes an encoder means for generating one or more select bits for switching on and off one or more of the M first driver cell means and one or more of the P second driver cell means.

54. The control circuit of claim 53, wherein the encoder means incrementally switches off one or more of the M first driver cell means and switches on one or more of the P second driver cell means having an equivalent current consumption.

55. The control circuit of claim 52, wherein the constant level corresponds to a substantially constant voltage swing amplitude of a signal that represents a difference between an output of the first amplifier means and the second amplifier means.

56. The control circuit of claim 52, wherein one or more of the M first driver cell means consumes a different amount of current relative to another one of the M first driver cell means.

57. The control circuit of claim 52, wherein one or more of the P second driver cell means consumes a different amount of current relative to another one of the P second driver cell means.

58. A method for changing a pre-emphasis ratio of a pre-emphasis circuit, the pre-emphasis circuit including a first amplifier and a second amplifier, the first amplifier including M first driver cells, the second amplifier including P second driver cells, M and P each being a number greater than zero, the method comprising:

generating one or more control signals operable to switch off one or more of the M first driver cells and switch on a corresponding one or more of the P second driver cells, such that a swing amplitude for an output signal provided by the pre-emphasis circuit is maintained at a constant level.

59. The method of claim 58, wherein generating one or more control signals includes generating one or more select bits for switching on and off one or more of the M first driver cells and one or more of the P second driver cells.

60. The method of claim 59, wherein switching on and off one or more of the M first driver cells includes incrementally switching off one or more of the M first driver cells and switching on one or more of the P second driver cells having an equivalent current consumption.

\* \* \* \* \*